United States Patent [19]

Patterson, III

[11] 4,450,414

[45] May 22, 1984

[54] HIGH TEMPERATURE CURRENT MIRROR AMPLIFIER

[75] Inventor: Raymond B. Patterson, III, Melbourne, Fla.

[73] Assignee: Harris Corporation, Melbourne, Fla.

[21] Appl. No.: 351,443

[22] Filed: Feb. 23, 1982

[51] Int. Cl.³ .............................................. H03F 3/10
[52] U.S. Cl. .................................. 330/288; 330/289
[58] Field of Search ...................... 330/288, 289, 257; 323/315, 316, 317

[56] References Cited

U.S. PATENT DOCUMENTS

| | | | |
|---|---|---|---|
| 3,629,691 | 12/1971 | Wheatley | 323/315 |
| 4,028,564 | 6/1977 | Streit et al. | 307/310 |
| 4,034,307 | 7/1977 | Schade, Jr. | 330/35 |
| 4,119,924 | 10/1978 | Ahmed | 330/288 |

OTHER PUBLICATIONS

Hellwarth, G. A., and Jaeger, R. C., "Ultrahigh Resistance Current Source and Differential Cascade Amplifier Application" *IBM Tech. Dis. Bull.*, vol. 16, No. 7, Dec. 1973.

RCA Technical Notes, "Leakage Current Compensation in Current Mirror Amplifier Circuitry" by Jack Avins, pp. 1-6.

*Primary Examiner*—James B. Mullins
*Assistant Examiner*—Steven J. Mottola
*Attorney, Agent, or Firm*—Barnes & Thornburg

[57] ABSTRACT

A high temperature current mirror amplifier having biasing means in the transdiode connection of the input transistor for producing a voltage to maintain the base-collector junction reversed-biased and a current means for maintaining a current through the biasing means at high temperatures so that the base-collector junction of the input transistor remained reversed-biased. For accuracy, a second current mirror is provided with a biasing means and current means on the input leg.

7 Claims, 2 Drawing Figures

HIGH TEMPERATURE CURRENT MIRROR AMPLIFIER

The Government has rights in this invention pursuant to Contract No. DE-AC04-76DPOO789 awarded by the U.S. Department of Energy.

BACKGROUND OF THE INVENTION

The present invention relates generally to current mirror amplifiers and, more specifically, to a current mirror amplifier designed for high temperature environments.

Most IC component characteristics are temperature dependent, however, only a few of them are of particular importance for high temperature circuit design. Leakage current is probably the most obvious problem parameter. In IC junctions, it doubles approximately every 11° C. reaching a few microamperes at 300° C. Leakage of this magnitude swamps the design currents used in low current strings of many operational amplifiers and other linear circuits. It also significantly increases the static power dissipation of CMOS circuits. Its voltage dependence leads to a leakage resistance which may significantly load the high impedance modes employed in some analog circuitry.

$H_{FE}$ increases with temperature which is beneficial to most circuit designs. However, between 200° C. and 300° C., $I_{CBO}$ becomes large enough that base current changes sign in most analog IC transistors. This defeats the operation of several commonly employed circuit configurations, such as simple current mirrors composed of a diode connected transistor whose base is connected to the base of the mirror transistor. Incremental current gain remains high even when base current is reversed since it is independent of $I_{CBO}$.

The resistivity of doped semiconductor layers increases until the intrinsic carrier density, $n_i$, which has exponential temperature dependence, is approximately equal to the doping impurity concentration N. Above the temperature, called the intrinsic temperature, at which this occurs, resistivity begins to decline rapidly due to the increased total carrier concentration $N+n_i$. The smaller N, the lower the intrinsic temperature.

For 4 ohm-cm material which is commonly used for linear NPN collectors and CMOS substrates, the maximum resistivity of 12 ohm-cm occurs at about 200° C. and $n_i=N$ at about 325° C. where resistivity is back down to about 4 ohm-cm. When both sides of a PN junction reach their intrinsic temperature, the junction loses its rectifying characteristic. This is one ultimate limit to high temperature circuit operation.

Many circuits have operating currents which are proportional to diffused resistors. At high temperature, their current may change by as much as a factor of two due to the resistor IC. Changes of that magnitude can induce large shifts in performance, in some cases even causing circuits to lose functionality.

The transconductance of a bipolar transistor given by the expression $g_m=(QI_E/KT)$ is inversely proportional to absolute temperature. It decreases by about a factor of two over the temperature range 25° C. to 300° C. having adverse effect on a number of linear circuit parameters including voltage gain.

The $V_F$ of PN diodes and $V_{BE}$ of bipolar transistors have a negative temperature coefficient of about 2 mV per °C. At 300° C. $V_{BE}$ of a typical IC transistor is about 100 mV. Many circuit bias schemes which depend upon $V_{BE}$ fail at high temperature often by forcing devices into saturation. Current matches set by matched $V_{BE}$s are more easily disrupted when the $V_{BE}$s are this low. Noise margins in the several types of logic where the margin is proportional to $V_{BE}$ become very small at 300° C.

Since current mirrors are based on the principle that the $V_{BE}$ of the input leg is used as a control of the $V_{BE}$ of the output leg, current mirrors are very susceptible to disruption in the high temperature environment. Also, the input transistor will go into saturation destroying the effectability of the input stage. Thus, there exists the need for a current mirror design which is capable of operating in the high temperature environments.

SUMMARY OF THE INVENTION

An object of the present invention is to provide a current mirror amplifier which is capable of operating at high temperature environments.

Another object of the present invention is to provide temperature compensating devices in a current mirror amplifier which maintains the input transdiode transistor out of saturation in high temperature environments.

These and other objects of the present invention are attained by providing a means in the transdiode collector-to-base connection of the input transistor of a current mirror for producing a voltage to maintain the base-collector junction of the input transistor reversed-biased. A current means is connected to the base of the input transistor for maintaining a current through the biasing means at high temperature so that the biasing means produces the voltage required at the high temperatures to maintain the base-to-collector junction of the input transistor reversed-biased. The current means includes a bipolar transistor having its collector connected to the base of the input transistor and its base and emitter connected together and to the emitter of the input transistor. The current means bipolar transistor becomes operable at a preselected temperature in the high temperature range to provide a current which tracks the change of the characteristics of the input transistor. To reduce any unbalance or error in the current mirror produced by the current means, a second tier of current mirrors is introduced having a biasing means on the base-to-collector transdiode connection of the transistor which is in series with the output transistor of the first current mirror and a current means connected to the base of the transdiode connector of the second current mirror. Because of the stacked effect of current mirrors, an element is inserted between the base of the input transistor of the first current mirror and its current means to provide a balance of the two legs of the current mirrors.

Other objects, advantages and novel features of the present invention will become apparent from the following detailed description of the invention when considered in conjunction with the accompanying drawings.

DESCRIPTION OF THE PREFERRED EMBODIMENTS

Figure 1:
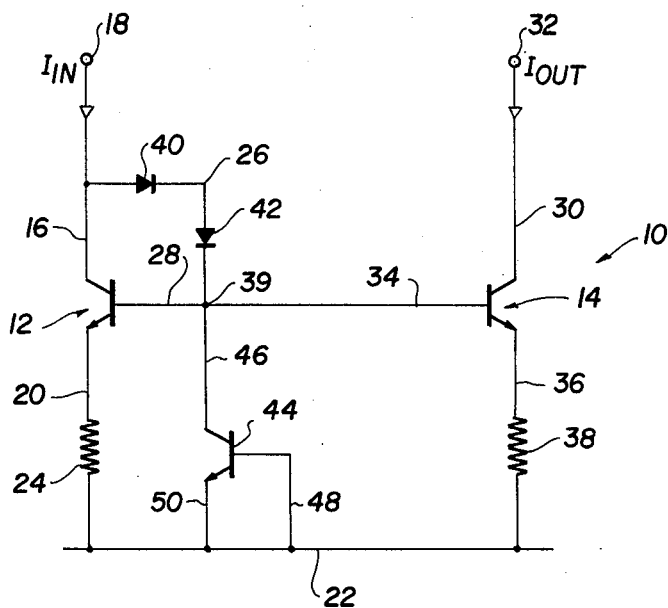
FIG. 1 is a schematic of a current mirror incorporating the principles of the present invention.

A current mirror 10 is illustrated in FIG. 1 as including an input bipolar transistor 12 and an output bipolar transistor 14. The collector 16 of the input transistor 12 is connected to the input terminal 18. The emitter 20 of the input bipolar transistor 12 is connected to a voltage supply terminal 22 by a resistor 24. A transdiode connection 26 connects the collector 16 to the base 28 of the input transistor 12. The output transistor 14 has its collector 30 connected to an output terminal 32, its base 34 connected to the base 28 of the input transistor 12 and its emitter 36 connected to the voltage supply terminal 22 by a resistor 38. The connection and operation of a current mirror amplifier described to this point, is well known and will not be described in detail. The importance of the operation of the current mirror is that the input transistor 12 stays out of saturation and in its linear range, that the current at the intersection or node 39 of the bases 28 and 34 of the input and output transistors 12 and 14 and the transdiode connection 26 is zero, and that the base-to-emitter voltage $V_{BE}$ of the input and output transistors 12 and 14 are equal.

As discussed in the Background of the Invention, at high temperatures between 200° C. and 300° C. the principles upon which the current mirror operates become invalid. In this high temperature range, the input transistor 12 will go into saturation and the base currents of both transistors reverse. To solve this problem, the present invention provides a biasing means in the transdiode connection 26 between the collector 16 and the base 28 of the input transistor 12 to maintain the base-collector junction of the input transistor reversed-biased and thus out of saturation. One example of such a biasing means illustrated in FIG. 1 includes a pair of series connected diodes 40 and 42. Other types of elements which produce the biasing required are, for example, a resistor or zener diode or any other type of voltage drop device. The importance being that a current through the transdiode connection 26 provides a voltage drop thereacross which maintains the base-to-collector junction of the input transistor 12 reversed-biased.

As previously discussed, the base current of the bipolar transistors 12 and 14 reverse at extremely high temperatures. Such a reversal will change the current balance at the node 39 of the intersection of the bases 28 and 34 of the input transistors 12 and 14 and the transdiode connection 26 thereby destroying the operation of the current mirror. To accommodate for such current reversals, a current sink, illustrated as transistor 44, is connected to the node 39 where the bases 28 and 34 of the input and output transistors 12 and 14, respectively, are connected. The transistor 44 has its collector 46 connected to node 39 and has its base 48 and emitter 50 tied together and to the voltage supply terminal 22.

In the normal operating range of the prior art, namely, below approximately 125° C., the bipolar transistor 44 operates as a base-collector diode connecting node 39 and the voltage supply line 22. At elevated temperatures in the 200° C. to 300° C. temperature range, the bipolar device 44 will sink from four to twenty times the collector-to-base current leakage of a device of the same type geometry. Thus, the geometry of 44 can be at least one quarter of the sum of the geometries of transistors 12 and 14.

The reason for this multiplicative effect is the rise in the concentration of thermally generated hole-electron pairs in the collector region to a significant number with respect to the impurity concentration. The resistivity of the doped semiconductor layers increases until the intrinsic carrier density, $n_i$, which is exponentially temperature dependent, is approximately equal to the doping impurity concentration N. Above the temperature, called the intrinsic temperature, at which this occurs, resistivity begins to decline rapidly due to the increased total carrier concentation $N+n_i$. The smaller N, the lower the intrinsic temperature. For 4 ohm-cm material which is commonly used for linear NPN collectors and CMOS substrates, the maximum resistivity of 12 ohm-cm occurs at about 200° C. and $n_i=N$ at about 325° C. where resistivity is back down to about 4 ohm-cm.

Also, in this temperature range, minority carriers diffusing into the collector-base depletion region are accelerated by the depletion region and given a velocity which causes them to move through the base and the base-emitter depletion region into the emitter where recombination is highly probable because of the short lifetime of the minority carriers in the heavily doped emitter material. This constitutes a flow of current from the collector to the emitter. Thus, the bipolar transistor 44 changes its configuration from a base-collector diode to a device conducting between the collector and emitter region. Thus, in effect, the amplification factor of the collector-to-emitter path is provided at a raised temperature which was not available at a lower temperature.

Since the phenonemon which makes the bipolar device 44 operable is the temperature at which the lightly doped collector becomes intrinsic, the operating point or intrinsic temperature of the bipolar transistor 44 may be selected by adjusting the impurity concentration of the collector. As discussed above, for a collector having a resistance of 4 ohm-cm, a bipolar transistor 44 begins to conduct more heavily at about 175° C. and maximizes at 200° C.

Figure 2:
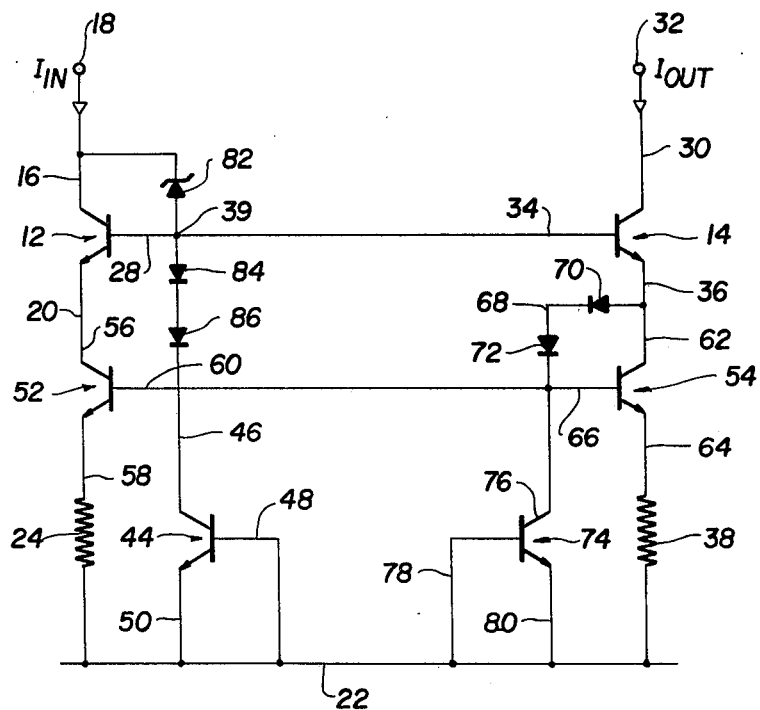
FIG. 2 is a schematic of a current mirror incorporating a second embodiment of the present invention.

Although the simple compensated mirror of FIG. 1 is an improvement over prior art devices for use at high temperatures, it may not be considered accurate enough for certain applications. FIG. 2 illustrates a current mirror scheme incorporating the principles of the present invention and introduces a second tier of mirror transistors and places a transdiode in the output leg of the current mirror. The elements of FIG. 1 which are common to FIG. 2 have the same reference number for sake of clarity and to reduce the description of the circuit.

The second tier of the current mirror includes emitter follower configured bipolar transistor 52 and transdiode 54 in the input and output legs of the previous current mirror stage, respectively. The collector 56 of transistor 52 is connected to the emitter 20 of the input transistor 12, the emitter 58 of transistor 52 is connected to the resistor 24 and transistor 52 has a base 60. The collector 62 of transistor 54 is connected to the emitter 36 of the output transistor 14, the emitter 64 of transistor 54 is connected to resistor 38 and base 66 of transistor 54 is connected to the base 60 of transistor 52. A transdiode connection 68 interconnects the collector 62 of transistor 54 and its base 66. In the transdiode connection are a pair of series diodes 70 and 72 which function similar to diodes 40 and 42 in FIG. 1 to provide a voltage to maintain the base-collector of transistor 54 reversed-biased. A current sink transistor 74 has its collector 76 connected to the base 66 of transistor 54 and its base 78 and emitter 80 tied together and to the voltage supply line 22. The current source sink device 74 acts similar to 44 in that it sinks the reversed base currents of transistors 52 and 54 of the second current mirror configuration so as to maintain a current through the transdiode connection 68 to maintain the transistor 54 out of saturation.

It should be noted that the diodes 40 and 42 in the transdiode connection of transistor 12 has been replaced by a zener diode 82 in FIG. 2. This illustrates the different type of device which may be placed in the transdiode connection to create the required voltage. In an effort to maintain the two legs of the pair of current mirror balance, the current sinking transistors 44 and 74 should be of identical geometry. Since their collectors are connected to different points in the input and output legs, compensation must be provided on the collector 46 of the transistor 44 in order to minimize any mismatch. Such a compensation is illustrated as a pair of series diodes 84 and 86 connected between the collectors 46 and the node 39 of the common bases 28 and 34 of transistors 12 and 14, respectively. The diodes 84 and 86 match the characteristics of diodes 70 and 72 in the transdiode connection 68 of the output leg. The difference between the input and output leg is the base-to-emitter voltage drop of transistor 14. But since this voltage is small at high temperatures, the legs are substantially balanced. Thus, the current mirror of FIG. 2 incorporates the principles of the present invention and provides greater accuracy at higher temperatures than the current mirror of FIG. 1.

It is evident from the description of the preferred embodiments that the objects of the invention are obtained and although the invention has been described and illustrated in detail, it is to be clearly understood that the same is by way of illustration and example only and is not to be taken by way of limitation. Although the current mirrors of FIGS. 1 and 2 have been illustrated using NPN transistors, they may also be built using PNP transistors. The importance is that the type of transistor used in the current sinks or sources is of the same type as used in the transistors used in the current mirror.

The spirit and scope of the present invention are to be limited only by the terms of the appended claims.

What is claimed is:

1. In a current mirror amplifier having an input transistor whose collector is connected to its base in a transdiode connection, its emitter connected to a voltage supply terminal and its collector connected to an input terminal and output transistor whose base is connected to the base of said input transistor, its emitter connected to said voltage supply terminal and its collector connected to an output terminal, the improvement comprising:
    biasing means in said transdiode connection of said input transistor for producing a voltage to maintain the base-collector junction of said input transistor reversed-biased; and
    current means connected to said base of said input transistor for maintaining a current through said biasing means at high temperatures so that said biasing means produces said voltage at high temperatures, said current means being operative above a selected temperature and inoperative below said selected temperature.

2. The current mirror amplifier according to claim 1, wherein said current means includes a bipolar transistor having its collector connected to said base of said input transistor and its base and emitter connected together to said supply voltage terminal.

3. The current mirror amplifier according to claim 2, wherein the geometry of said bipolar transistor of said current means is at least half the sum of the geometries of said input and output transistors.

4. The current mirror amplifier according to claim 2, wherein the impurity concentration of the collector region of said bipolar transistor of said current means determines said selected temperature of operability of said current means.

5. The current mirror amplifier according to claim 1 including:
    a first emitter follower configured bipolar transistor having its collector connected to said emitter of said input transistor, its emitter connected to said voltage supply terminal and a base;
    a second emitter follower configured bipolar transistor having its collector connected to said emitter of said output transistor, its emitter connected to said voltage supply terminal and its base connected to said base of said first emitter follower transistor;
    second biasing means connected between the collector and base of said second emitter follower transistor for producing a voltage to maintain the base-collector junction of said second emitter follower transistor reverse-biased; and
    second current means connected to said base of said second emitter follower transistor for maintaining a current through said second biasing means at high temperatures so that said second biasing means produces said voltage at high temperatures.

6. The current mirror amplifier according to claim 5, including means connected between said base of said input transistor and said first mentioned current means for matching the characteristics of the input first mentioned current means to said second current means.

7. In a current mirror amplifier having an input transistor whose collector is connected to its base in a transdiode connection, its emitter connected to a voltage supply terminal and its collector connected to an input terminal and output transistor whose base is connected to the base of said input transistor, its emitter connected to said voltage supply terminal and its collector connected to an output terminal, the improvement comprising:
    biasing means in said transdiode connection of said input transistor for producing a voltage to maintain the base-collector junction of said input transistor reversed-biased; and
    current means connected to said base of said input transistor for maintaining a current through said biasing means, said current means comprising a bipolar transistor having its collector connected to said base of said input transistor and its base and emitter connected together to said supply voltage terminal.

* * * * *